US007473090B2

(12) United States Patent
McMackin et al.

(10) Patent No.: US 7,473,090 B2

(45) Date of Patent: Jan. 6, 2009

(54) IMPRINT LITHOGRAPHY TEMPLATE TO FACILITATE CONTROL OF LIQUID MOVEMENT

(75) Inventors: Ian M. McMackin, Austin, TX (US); Pankaj B. Lad, DeSoto, TX (US); Van N. Truskett, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 11/762,378

(22) Filed: Jun. 13, 2007

(65) Prior Publication Data

US 2007/0243279 A1 Oct. 18, 2007

Related U.S. Application Data

(60) Continuation of application No. 11/051,941, filed on Feb. 4, 2005, now abandoned, which is a division of application No. 11/051,533, filed on Feb. 4, 2005, and a continuation of application No. 11/108,208, filed on Apr. 18, 2005, which is a division of application No. 11/047,428, filed on Jan. 31, 2005, and a division of application No. 11/047,499, filed on Jan. 31, 2005.

(51) Int. Cl.
*B29C 35/08* (2006.01)

(52) U.S. Cl. ....................... 425/385; 425/394; 425/403; 425/408

(58) Field of Classification Search ................. 425/385, 425/394, 395, 403, 408
See application file for complete search history.

(56) References Cited

U.S. PATENT DOCUMENTS 3,577,593 A 5/1971 Jackson
3,677,178 A 7/1972 Gipe
4,391,511 A 7/1983 Akiyama et al.
4,506,184 A 3/1985 Siddall
4,722,878 A 2/1988 Watakabe et al.
4,959,252 A 9/1990 Bonnebat et al.
5,016,691 A 5/1991 Bernier
5,206,983 A 5/1993 Guckel et al.
5,477,058 A 12/1995 Sato (Continued)

FOREIGN PATENT DOCUMENTS

CN 1442757 A 9/2003

(Continued)

OTHER PUBLICATIONS

Sowah, Diamond used to Break the Mould, Retrieved Sep. 2, 2003 from URL: http://www.electronictimes.com/story/OEG20020918S0003 Sep. 18, 2002.

(Continued)

*Primary Examiner*—Yogendra Gupta
*Assistant Examiner*—Thu Khanh T Nguyen
(74) *Attorney, Agent, or Firm*—Fish & Richardson P.C.

(57) ABSTRACT

The present invention is directed to a template that features a control surface extending from a periphery of a mold toward a recessed surface of the template forming an oblique angle between a portion of the control surface disposed proximate to the periphery.

15 Claims, 3 Drawing Sheets

50
56
57
52
55
d
54
Φ
60
62
12
53
P
18
16

U.S. PATENT DOCUMENTS

| | | | |
|---|---|---|---|
| 5,534,073 | A | 7/1996 | Kinoshita et al. |
| 5,772,905 | A | 6/1998 | Chou |
| 5,804,017 | A | 9/1998 | Hector |
| 5,817,376 | A | 10/1998 | Everaerts et al. |
| 5,885,514 | A | 3/1999 | Tensor |
| 5,937,758 | A | 8/1999 | Maracas et al. |
| 6,117,708 | A | 9/2000 | Wensel |
| 6,165,911 | A | 12/2000 | Calveley |
| 6,190,929 | B1 | 2/2001 | Wang et al. |
| 6,261,469 | B1 | 7/2001 | Zakhidov et al. |
| 6,305,925 | B1 | 10/2001 | Cassani |
| 6,309,580 | B1 | 10/2001 | Chou |
| 6,316,290 | B1 | 11/2001 | Wensel |
| 6,334,960 | B1 | 1/2002 | Willson et al. |
| 6,387,787 | B1 | 5/2002 | Mancini et al. |
| 6,399,406 | B2 | 6/2002 | Chan et al. |
| 6,446,933 | B1 | 9/2002 | Westmoreland |
| 6,517,977 | B2 | 2/2003 | Resnick et al. |
| 6,605,849 | B1 | 8/2003 | Lutwak et al. |
| 6,607,173 | B2 | 8/2003 | Westmoreland |
| 6,664,026 | B2 | 12/2003 | Nguyen et al. |
| 6,696,220 | B2 | 2/2004 | Bailey et al. |
| 6,716,754 | B2 | 4/2004 | Hofmann et al. |
| 6,743,368 | B2 | 6/2004 | Lee |
| 6,753,131 | B1 | 6/2004 | Rogers et al. |
| 6,780,001 | B2 | 8/2004 | Eldridge et al. |
| 6,808,646 | B1 | 10/2004 | Jeans |
| 6,852,454 | B2 | 2/2005 | Mancini et al. |
| 6,890,688 | B2 | 5/2005 | Mancini et al. |
| 6,916,584 | B2 | 7/2005 | Sreenivasan et al. |
| 7,037,639 | B2 | 5/2006 | Voisin |
| 7,136,150 | B2 | 11/2006 | Sreenivasan et al. |
| 7,140,861 | B2 | 11/2006 | Watts et al. |
| 7,179,079 | B2 | 2/2007 | Sreenivasan et al. |
| 7,229,273 | B2 | 6/2007 | Bailey et al. |
| 7,279,113 | B2 | 10/2007 | Watts et al. |
| 2002/0098426 | A1 | 7/2002 | Sreenivasan et al. |
| 2002/0122993 | A1 | 9/2002 | Katakura |
| 2002/0135099 | A1 | 9/2002 | Robinson et al. |
| 2002/0159918 | A1 | 10/2002 | Tseng et al. |
| 2002/0175298 | A1 | 11/2002 | Moniwa et al. |
| 2003/0166814 | A1 | 9/2003 | Sparrowe et al. |
| 2003/0180631 | A1 | 9/2003 | Shiota et al. |
| 2003/0224262 | A1 | 12/2003 | Lof et al. |
| 2004/0141163 | A1 | 7/2004 | Bailey et al. |
| 2004/0163563 | A1 | 8/2004 | Sreenivasan et al. |
| 2004/0202865 | A1 | 10/2004 | Homola et al. |
| 2004/0219246 | A1 | 11/2004 | Jeans |
| 2005/0064344 | A1 | 3/2005 | Bailey et al. |
| 2005/0084804 | A1 | 4/2005 | Truskett et al. |
| 2005/0098534 | A1 | 5/2005 | Sreenivasan et al. |
| 2005/0158637 | A1 | 7/2005 | Kim et al. |
| 2005/0184436 | A1 | 8/2005 | Jeong et al. |
| 2006/0019183 | A1 | 1/2006 | Voisin |
| 2006/0032437 | A1 | 2/2006 | McMackin et al. |
| 2006/0172031 | A1 | 8/2006 | Babbs et al. |
| 2006/0172549 | A1 | 8/2006 | Choi et al. |
| 2006/0172553 | A1 | 8/2006 | Choi et al. |
| 2006/0177532 | A1 | 8/2006 | Fletcher et al. |
| 2006/0177535 | A1 | 8/2006 | McMackin et al. |
| 2006/0266916 | A1 | 11/2006 | Miller et al. |
| 2007/0122942 | A1 | 5/2007 | Sreenivasan et al. |
| 2007/0190200 | A1 | 8/2007 | Cherala et al. |

FOREIGN PATENT DOCUMENTS

| | | | |
|---|---|---|---|
| EP | 0974458 | A1 | 12/2001 |
| EP | 1460738 | A2 | 9/2004 |
| GB | 494877 | | 11/1938 |
| GB | 1139808 | | 1/1969 |
| JP | 61-40845 | | 2/1986 |
| JP | 2-063803 | | 3/1990 |
| JP | 2-248480 | | 10/1990 |
| JP | 3-90345 | | 4/1991 |
| JP | 9-278490 | | 10/1997 |
| JP | 2005-267738 | | 9/2005 |
| JP | 2006-315207 | | 11/2006 |

OTHER PUBLICATIONS

Shibuichi et al., Super Water- and Oil-Repellent Surfaces Resulting from Fractal Structure, Journal of Colloid and Interface Science, vol. 208, No. 1, pp. 287-294 Dec. 1, 1998.

Resnick et al., High Resolution Templates for Step and Flash Imprint Lithography, Journal of Microlithography, Microfabrication, and Microsystems, vol. 1 No. 3. Oct. 1, 2002.

Taniguchi et al., Diamond Nanoimprint Lithography, Nanotechnology, 2002, vol. 13, No. 5, pp. 592-596(5) Jan. 1, 2002.

Kiyohara et al., Abstract of Plasma Etching of CVD Diamond Films using an ECR-type Oxygen Source, http://www.iop.org/EJ/abstract/0957-4484/10/4/304 Sep. 26, 2003.

Abstract of Japanese Patent 61-040845, Feb. 27, 1986.

Abstract of Japanese Patent 02-248480, Oct. 4, 1990.

Abstract of Japanese Patent 3-090345, Apr. 16, 1991.

Abstract of Japanese Patent 09-278490, Oct. 28, 1997.

Abstract of Japanese Patent 61-040845, Feb. 27, 1986.

Abstract of Japanese Patent 02-248480, Oct. 4, 1990.

Thompson et al., Fabrication of Step and Flash Imprint Lithography Templates Using Commercial Mask Processes, SPIE Microlithography Conference Feb. 1, 2003.

Gehoski et al., Indium Tin Oxide Template Development for Step and Flash Imprint Lithgraphy, SPIE Microlithography Conference Feb. 1, 2005.

Dauksher et al., Step and Flash Imprint Lithography Template Characterization, from an Etch Perspective, J. Vac. Sci. Technol. B 21(6), pp. 2771-2776 Nov. 1, 2003.

Resnick et al., Imprint Lithography: Lab Curiosity or the Real NGL?, SPIE Microlithography Conference Feb. 1, 2003.

Mancini et al., Analysis of Critical Dimension Uniformity for Step and Flash Imprint Lithography, SPIE Microlithography Conference Feb. 1, 2003.

Mancini et al., Hydrogen Silsesquioxane for Direct Electron-Beam Patterning of Step and Flash Imprint Lithography Templates, J. Vac. Sci. Technol. B 20(6), pp. 2896-2901 Nov. 1, 2002.

Dauksher et al., Chracterization of and Imprint Results Using Indium Tin Oxide-Based Step and Flash Imprint Lithography Templates, J. Vac. Sci. Technol. B 20(6), pp. 2857-2861 Nov. 1, 2002.

Nordquist et al., Critical Dimension and Image Placement Issues for Step and Flash Imprint Lithography Templates, 22nd Annual BACUS Symposium on Photomask Technology, Monterey, CA Sep. 1, 2002.

Bailey et al., Template Fabrication Schemes for Step and Flash Imprint Lithography, Microelectronic Engineering, 61-62, pp. 461-467 Jan. 1, 2002.

Resnick et al., High Resolution Templates for Step and Flash Imprint Lithography, SPIE Microlithography Conference Feb. 1, 2002.

Resnick et al., New Methods for Fabricating Step and Flash Imprint Lithography Templates, NIST-SPIE Conference on Nanotechnology Sep. 1, 2001.

Translation of Japanese Patent 61-40845, Feb. 1, 1986.

Translation of Japanese Patent 02-248480, Oct. 1, 1990.

Translation of Japanese Patent 03-090345, Apr. 1, 1991.

Translation of Japanese Patent 09-278490, Oct. 1, 1997.

Abstract of Japanese Patent 03-090345, Apr. 1, 1991.

Abstract of Japanese Patent 09-278490, Oct. 1, 1997.

Bien et al., Characterization of Masking Materials for Deep Glass Micromachining, J. Micromech. Microeng. 13 pp. S34-S40 Jan. 1, 2003.

Britten et al., Multiscale, Multifuncation Diffractive Structures We Etched into Fused Silica for High-Laser Damage Threshold Applications, Applied Optics, vol. 37, No. 30 Oct. 20, 1998.

Fletcher et al., Microfabricated Silicon Solid Immersion Lens, Jounral of Microelectromechanical Systems, vol. 10, No. 3 Sep. 1, 2001.

Khandaker et al., Fabrication of Microlens Arrays by Direct Electron Beam Exposure of Photoresist, Pure Appl. Opt. 6, pp. 637-641 Jan. 1, 1997.

Kim et al., Replication Qualities and Optical Properties of UV-moulded Microlens Arrays, J. Phys. D: Appl. Phys. 36; pp. 2451-2456 Jan. 1, 2003.

Kobayashi et al., Batch Bulk-Mircomachined High-Precision Metal-On-Insulator Microspires and Their Application to Scanning Tunneling Microscopy, J. Micromech. Microeng. 14; pp. S76-S81 Jan. 1, 2004.

Konijn et al., Nanoimprint Lithography of Sub-100nm 3D Structures, Microelectronic Engineering 78-79; pp. 653-658 Jan. 1, 2005.

Kunnavakkam et al., Low-cost, Low-loss Microlens Arrays Fabricated by Soft-Lithography Replication Process, Applied Physics Letters, vol. 82, No. 8 Feb. 24, 2003.

Mansell et al., Binary-Optic Smoothing with Isotropic Etching, Applied Optics; vol. 36, No. 20 Jul. 10, 1997.

Waheed et al., Balancing Aerial Image Intensity for Alternating Aperture Phase Shift Masks Using an Isotropic Dry-Etch, Proceedings of SPIE vol. 5130 Apr. 18, 2003.

Sano et al., Submicron Spaced Lens Array Process Technology for a High Photosensitivity CCD Image Sensor, IEEE IEDM Dig.: pp. 283-286 Jan. 1, 1990.

Tsukamoto et al., High Sensitivity Pixel Technology for a 1/4 inch PAL 430k pixel IT-CCD, IEE Custom Integrated Circuits Conference Jan. 1, 1996.

Yoneda et al., Translation of Japanese Patent 02-248480, Transparent Substrate with Water-Repellent and Antistaining Properties, and Structure Equipped Therewith Oct. 4, 1990.

Yoneda et al., Translation of Japanese Patent 02-248480, Transparent Substrate Material with Water-Repllent and Anti-Staining Properties and Structure Equipped with Same Oct. 4, 1990.

Morita et al., Three-Dimensional Nanoimprint Fabrication by Focused-Ion-Beam Chemical Vapor Deposition, Jpn. J. Appl. Phys., vol. 42, Pt. 1, No. 6B, pp. 3874-3876 Jan. 1, 2003.

U.S. Appl. No. 11/744,698, naming Inventors Resnick et al., entitled Template Having a Varying Thickness to Facilitate Expelling a Gas Positioned Between a Substrate and the Template, filed May 4, 2007.

Abstract of Japanese Patent 2-063803, Date Unknown.

Abstract of Japanese Patent 2006-315207, Date Unknown.

Hara K et al., An Alignment Technique Using Diffracted Moire Signals, Journal of Vacuum Science and Technology: Part B, AVS/AIP, Melville, New York, NY, US, vol. 7, No. 6; pp. 1977-1979 Nov. 1, 1989.

Application No. 11/760,855, naming inventors Bailey et al., entitled Imprint Lithography Template Having a Feature Size Under 250 nm, filed Jun. 11, 2007.

OCT/US2006/001160 International Search Report, Jun. 12, 2008.

IMPRINT LITHOGRAPHY TEMPLATE TO FACILITATE CONTROL OF LIQUID MOVEMENT

CROSS-REFERENCE TO RELATED APPLICATION

The present is a continuation application of U.S. patent application Ser. No. 11/051,941 entitled "Imprint Lithography Template to Facilitate Control of Liquid Movement" filed Feb. 4, 2005 now abandoned; which is a divisional of U.S. patent application Ser. No. 11/051,533 entitled "Imprint Lithography Method to Control Extrusion of a Liquid from a Desired Region on a Substrate" filed Feb. 4, 2005 currently pending; and a continuation application of U.S. patent application Ser. No. 11/108,208 entitled "Methods of Separating a Mold from a Solidified Layer Disposed on a Substrate" filed Apr. 18, 2005 currently pending; which is a divisional of U.S. patent application Ser. No. 11/047,428 entitled "Chucking System for Nano-Manufacturing" filed Jan. 31, 2005 currently pending; and is a divisional of U.S. patent application Ser. No. 11/047,499 entitled "Method of Retaining a Substrate to a Wafer Chuck" filed Jan. 31, 2005 currently pending; all of which are incorporated herein by reference.

STATEMENT REGARDING FEDERALLY SPONSORED RESEARCH OR DEVELOPMENT

The United States government has a paid-up license in this invention and the right in limited circumstance to require the patent owner to license others on reasonable terms as provided by the terms of 70NANB4H3012 awarded by National Institute of Standards (NIST) ATP Award.

BACKGROUND OF THE INVENTION

The field of the invention relates generally to micro-fabrication techniques. More particularly, the present invention is directed to a template to control movement of a liquid suitable for imprint lithography.

The prior art is replete with examples of exemplary micro-fabrication techniques. One particularly well-known micro-fabrication technique is imprint lithography. Imprint lithography is described in detail in numerous publications, such as U.S. published patent application Ser. No. 2004/0,065,976 filed as U.S. patent application Ser. No. 10/264,960, entitled "Method and a Mold to Arrange Features on a Substrate to Replicate Features having Minimal Dimensional Variability"; U.S. published patent application Ser. No. 2004/0,065,252 filed as U.S. patent application Ser. No. 10/264,926, entitled "Method of Forming a Layer on a Substrate to Facilitate Fabrication of Metrology Standards"; and U.S. Pat. No. 6,936,194 entitled "Method and a Mold to Arrange Features on a Substrate to Replicate Features having Minimal Dimensions Variability"; all of which are assigned to the assignee of the present invention. The fundamental imprint lithography technique as shown in each of the aforementioned published patent applications includes formation of a relief pattern in a polymerizable layer and transferring a pattern corresponding to the relief pattern into an underlying substrate. To that end, a template, having a mold, is employed. The mold is spaced-apart from, and in superimposition with, the substrate with a formable liquid present therebetween. The liquid is patterned and solidified to form a solidified layer that has a pattern recorded therein that is conforming to a shape of A mold. The substrate and the solidified layer may then be subjected to processes to transfer, into the substrate, a relief image that corresponds to the pattern in the solidified layer.

One manner in which to locate the polymerizable liquid between the template and the substrate is by depositing the liquid on the substrate as one or more droplets, referred to as a drop dispense technique. Thereafter, the polymerizable liquid is concurrently contacted by both the template and the substrate to spread the polymerizable liquid over the surface of the substrate. It is desirable to have the liquid confined to an area of the substrate in superimposition with the mold.

Thus, there is a need to provide greater control over movement of a liquid during imprint lithographic processes.

SUMMARY OF THE INVENTION

The present invention is directed to a template that features a control surface extending from a periphery of a mold toward a recessed surface of the template forming an oblique angle between a portion of the control surface disposed proximate to the periphery. In this fashion, a capillary force gradient may be created between THE imprinting material and the surface of the template facing the imprinting material. This provides greater control over a quantity of imprinting material extruding from a volumetric gap defined between the mold and a region of a substrate in superimposition. As a result, formation of undesirable artifacts during imprint lithography is reduced, if not avoided. These and other embodiments of the present invention are discussed more fully below.

DETAILED DESCRIPTION OF THE INVENTION

Figure 1:
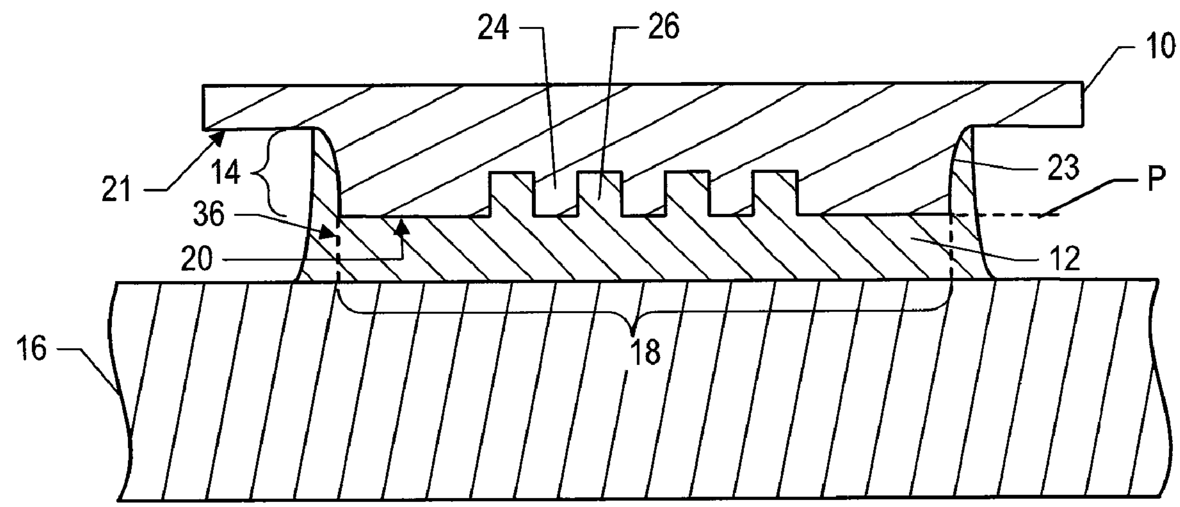
FIG. 1 is a cross-sectional view of a template, having disposed opposite to a substrate with imprinting material disposed therebetween, in accordance with the prior art.

Referring to FIG. 1, a template 10 is shown in contact with imprinting material 12, with imprinting material 12 being disposed between a mold 14 and substrate 16 in furtherance of patterning imprinting material. To that end, mold 14 is spaced-apart from substrate 16 and imprinting material 12 substantially fills a volumetric gap defined between mold 14 and a region 18 of substrate 16 in superimposition therewith. Thereafter, imprinting material 12 is solidified by exposing the same to an actinic component. In this manner, the shape of a surface 20 of mold 14, facing imprinting material 12, is recorded therein by formation of solidified imprinting layer 22, shown in FIG. 2.

Figure 2:
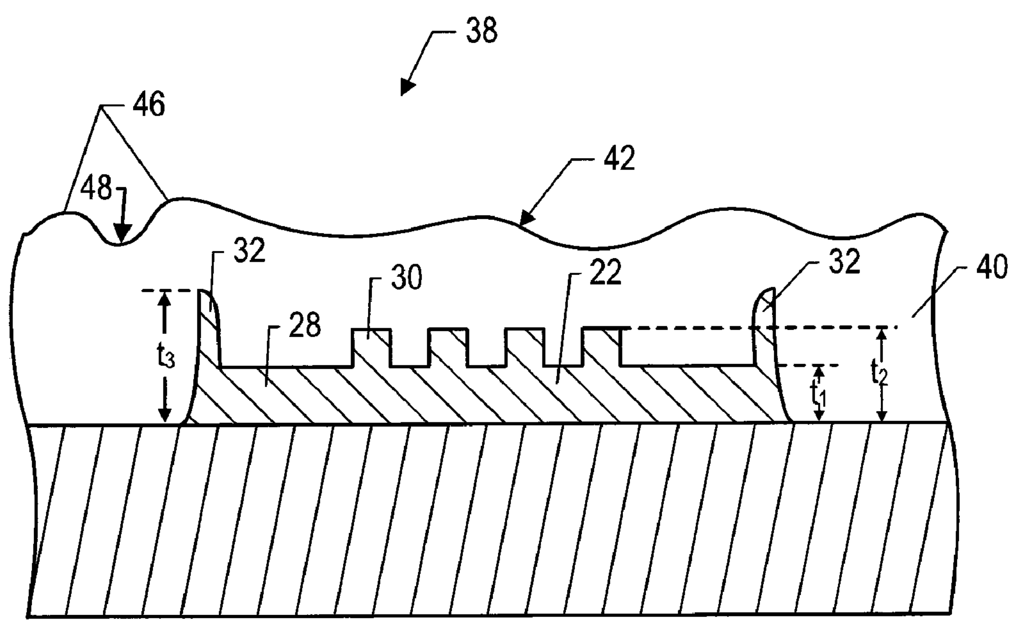
FIG. 2 is a cross-sectional view of a solidified imprinting layer formed upon the substrate employing the template shown in FIG. 1, having a conformal layer disposed thereon in accordance with the prior art.

Referring to FIGS. 1 and 2, surface 20 of mold 14 is patterned by inclusion of a plurality of protrusions 24 and recessions 26. The apex portion of each of protrusions 24 lies in a common plane, P. It should be understood, however, that surface 20 may be substantially smooth, without protrusions 24 and recessions 26, if not planar.

The actinic component employed to solidify imprinting material 12 may be any known substance, depending upon the composition of imprinting material 12. Exemplary compositions for imprinting material 12 are disclosed in U.S. published patent application Ser. No. 2005/0,160,934, filed as U.S. patent application Ser. No. 10/763,885, filed Jan. 24, 2003, entitled Materials and Methods for Imprint Lithography, which is incorporated by reference. As a result, the actinic component employed is typically ultraviolet wavelengths, and mold 14, not the entire template 10, is fabricated from fused silica. However, other actinic components may be employed, e.g., thermal, electromagnetic and the like.

Imprinting material 12 may be deposited upon either substrate 16 and/or template 10 employing virtually any known technique, dependent upon the composition employed. Such deposition techniques include but are not limited to, chemical vapor deposition (CVD), physical vapor deposition (PVD) spin-coating, and drop dispense techniques. After formation of solidified imprinting layer 22, mold 14 is separated therefrom, and solidified imprinting layer 22 remains on substrate 16. Solidified imprinting layer 22 includes residual regions 28 having a thickness $t_1$ and projections 30 having a thickness $t_2$, with $t_1$ being 10 nm or greater and $t_2$ being 40 nm or greater. Control of the dimensions of features recorded in solidified imprinting layer 22 is dependent, in part, upon the volume of imprinting material 12 in superimposition with region 18. As a result, attempts have been undertaken to confine imprinting material 12 to the volumetric gap during imprinting processes.

One attempt to confine imprinting material 12 to the volumetric gap includes forming mold 14 on template 10 as a mesa. To that end, mold 14 extends from a recessed surface 21 of template 10 and terminates in plane. Sidewall 23 functions to assist confining imprinting material 12 within the volumetric gap due to the lack of capillary attraction between imprinting material 12 and mold 14 outside the volumetric gap. Specifically, sidewall 23 is provided with sufficient length to reduce the probability that capillary attraction between recessed surface 21 and imprinting material 12 occurs.

Occasionally during the imprinting process, imprinting material 12 may extrude beyond the volumetric gap so as to lie outside of region 18 and/or surface 60. This may be due to, inter alia, fluid pressure generated in imprinting material 12 while being compressed between substrate 16 and mold 14. Further, the fluid pressure causes a sufficient quantity of imprinting material 12 to extrude beyond the volumetric gap so that capillary attraction between this material and recessed surface 21 occurs. As a result, formed, proximate to the periphery of region 18, are extrusions 32. Extrusions 32 have a thickness $t_3$ that may be several orders of magnitude larger than thicknesses $t_1$ and $t_2$, depending upon the spacing between surface 34 and region 18. For example, thickness $t_3$ may be 2 μm-15 μm. The presence of extrusions 32 may be problematic. For example, imprinting material 12 contained in extrusions 32 may not completely cure when exposed to the actinic component. This may result in imprinting material 12 accumulating at a periphery 36 of mold 14. Additionally, upon separation of mold 14 from solidified imprinting layer 22, imprinting material 12 in extrusions 32 may spread over the remaining portions of substrate 16 lying outside of the volumetric gap. Additionally, extrusions 32 may become cured, which can result in same remaining on substrate 16 as part of solidified imprinting layer 22. Any of the aforementioned effects of extrusions 32 can generate unwanted artifacts during subsequent imprinting processes.

Figure 3:
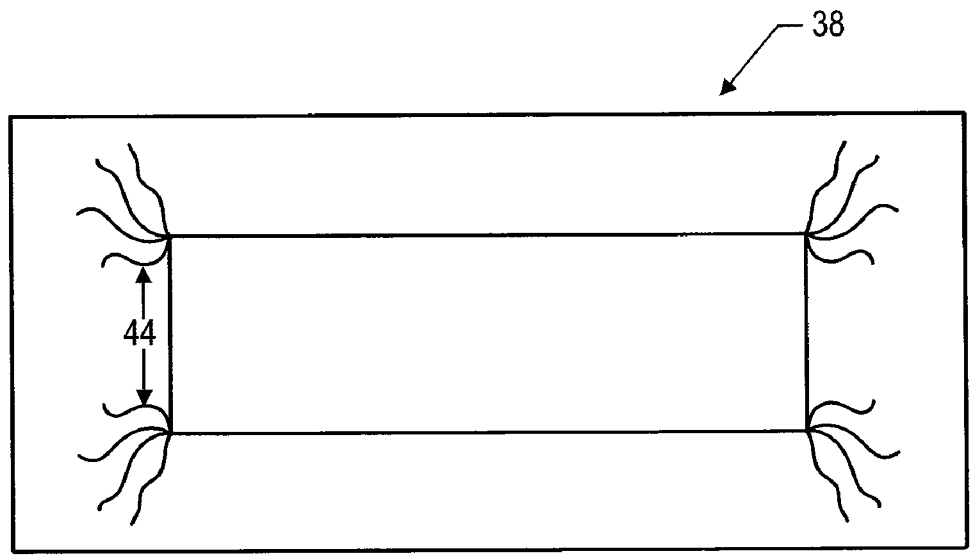
FIG. 3 is a simplified top-down view of the conformal layer shown in FIG. 2, in accordance with the prior art.

Referring to FIGS. 2 and 3, were extrusion 32 partially cured, for example, control of the thickness of subsequently disposed layers becomes problematic. This is shown by formation of multi-layered structure 38 resulting from the deposition of a conformal layer 40 upon solidified imprinting layer 22. In the present example, conformal layer 40 is formed employing spin-on techniques as discussed in U.S. patent application Ser. No. 7,122,079, filed on Feb. 27, 2004 entitled "Composition for an Etching Mask Comprising a Silicon-Containing Material." The presence of extrusions 32, hoWever, reduces the planarity of the surface 42 ordinarily expected from spin-on deposition of conformal layer 40. The presence of extrusions 32 results in the formation of deleterious artifacts, such as thickness variations, in conformal layer 40. These deleterious artifacts present asprotrusions in surface 42, are generally referred to as comets 44. Comets 44 are, typically, undesirable artifacts, because the same produce peaks 46 and troughs 48 in surface 42. As a result, surface 42 is proyided with a roughness that hinders patterning very small features. Similar roughness problems in subsequently formed surfaces arise in the presence of artifacts generated by extrusions 32.

Figure 4:
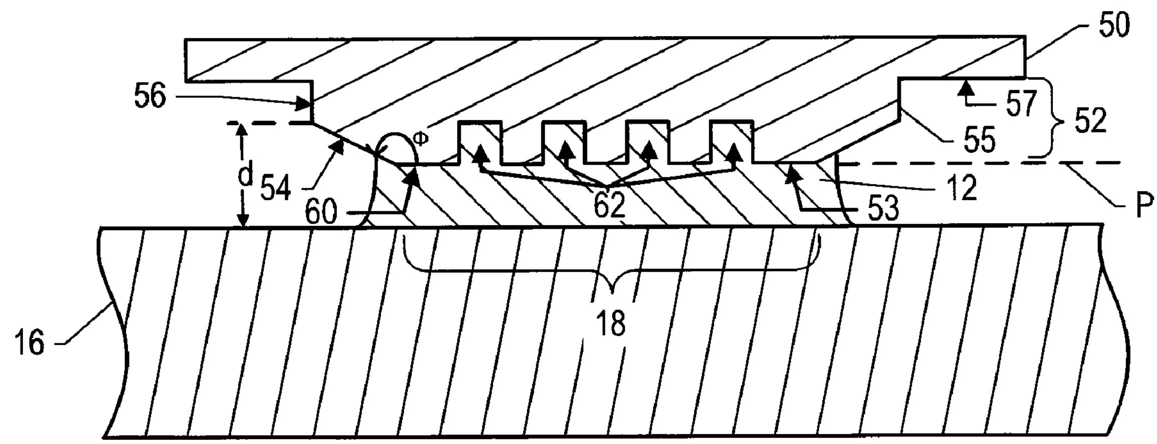
FIG. 4 is a cross-sectional view of a template, having disposed opposite to a substrate with imprinting material disposed therebetween, in accordance with the present invention.

Referring to FIG. 4, to avoid the deleterious artifacts, the present invention reduces, if not prevents, an amount of imprinting material 12 from extruding outside the volumetric gap. To that end, a template 50 includes a mold 52 layer and both are substantially the same as discussed above with respect to template 10 and mold 14, excepting that template 50 includes a capillary force control (CFC) surface 54. CFC surface 54 extends between mold 52 and sidewall 56 forming an angle Φ with respect to plane P. CFC surface 54 functions to control, if not prevent, a quantity of imprinting material 12 from extruding outside the volumetric gap by avoiding an orthogonal angle being formed between periphery 53 of mold 52 and CFC surface 54. Specifically, it was recognized that a certain quantity of imprinting material 12 may extend beyond the volumetric gap defined between region 18 and surface 60 in superimposition therewith. With this realization, implemented is control, rather than avoidance, of imprinting material extruding from the volumetric gap. To that end, CFC surface 54 is selected to produce a gradient of capillary forces proximate to periphery 53, with imprinting material 12 that comes in contact therewith. This is achieved, in part, by forming an oblique angle Φ between CFC surface 54 and periphery 53.

CFC surface 54 extends upwardly away from plane P and outwardly away from region 18, producing a linear increase in the distance with respect to substrate 16 to a maximum distance d and without having to vary the volumetric gap, i.e., the volume of the volumetric gap remains constant. The result of the linear increase in the distance of separation between template 50 and substrate 16 produces a force gradient in the capillary forces generated by contact between imprinting material 12 and CFC surface 54. Specifically, the farther imprinting material 12 extrudes from the volumetric gap, the greater the distance d between CFC surface 54 and substrate 16; hence, the lesser the capillary forces. By selecting the appropriate angle Φ and length of CFC surface 54, the amount of a given imprinting material 12, subjected to a given compression force between surface 60 and region 18, extruding beyond the volumetric gap may be controlled. This, in turn, facilitates control over the size of extrusions and/or the quantity of uncured imprinting material 12 that may spread to other regions of substrate 16 during separation of mold 52, after solidification of imprinting material 12 as discussed above. It is desired, however that the aspect ratio of width and height of CFC surface 54, as defined by the length and angle Φ, be on the order of the protrusions and projections.

Figure 5:
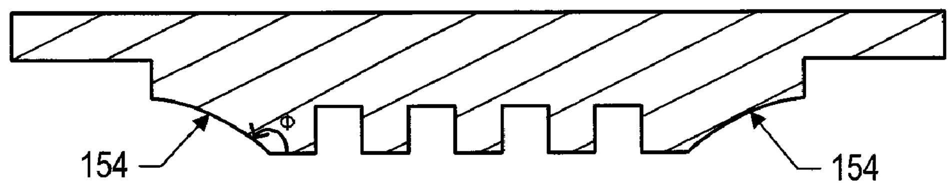
FIG. 5 is a cross-sectional view of a template shown in FIG. 4 in accordance with a first alternate embodiment of the present invention.
Figure 6:
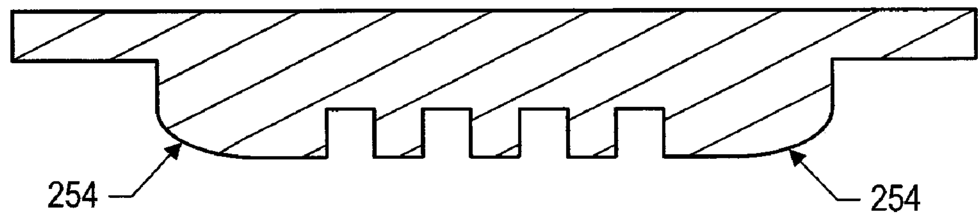
FIG. 6 is a cross-sectional view of a template shown in FIG. 4 in accordance with a second alternate embodiment of the present invention.

It should be understood that gradually decreasing capillary forces between imprinting material 12 and template 50 may be achieved by providing CFC surface 54 with a variety of shapes. For example, CFC surface 54 may be configured so that the distance between the surfaces of template 50 and substrate 16 vary exponentially, while maintaining a constant volumetric gap. To that end, CFC surface 54 may have a concave shape shown as surface 154, in FIG. 5, or a convex shape, shown as surface 254 in FIG. 6, with the angle Φ formed between periphery 53 and one of surfaces 154 and 254 being an oblique angle. The rate of curvature of surfaces 154 and 254 are established such that the quantity of imprinting material 12 extending beyond region 18 remains within desired parameters.

Figure 7:
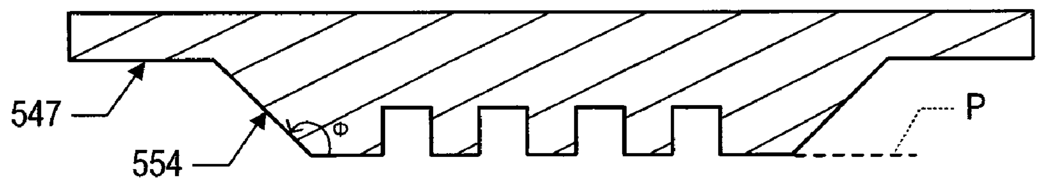
FIG. 7 is a cross-sectional view of a template shown in FIG. 4 in accordance with a fifth alternate embodiment of the present invention.
Figure 8:
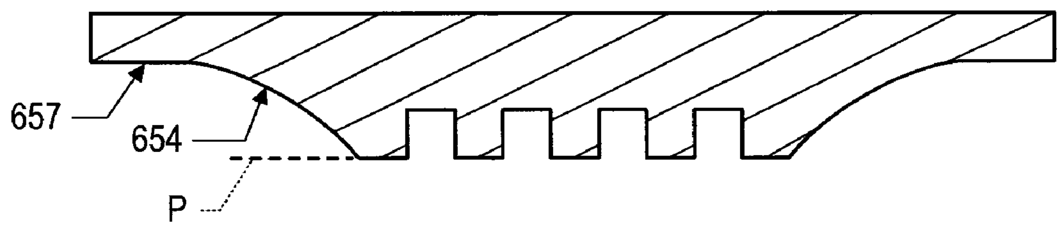
FIG. 8 is a cross-sectional view of a template shown in FIG. 4 in accordance with a sixth alternate embodiment of the present invention.
Figure 9:
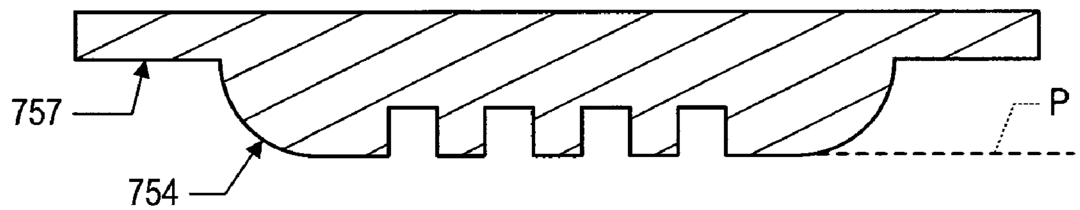
FIG. 9 is a cross-sectional view of a template shown in FIG. 4 in accordance with a seventh alternate embodiment of the present invention.

In a further embodiment, capillary force control (CFC) surface 554 extends between plane P and recessed surface 547, shown in FIG. 7, i.e., without the presence of sidewall 23 as shown in FIG. 4. To that end, CFC surface 654 may extend between plane P and recessed surface 657 so as to have a concave shape, shown in FIG. 8 or a convex shape, shown as surface 757 extending between plane P and recessed surface 747 in FIG. 9.

Referring again to FIG. 1, in a further embodiment, to further improve the control of extrusion of imprinting material 12 beyond region 18, the wetting characteristics of CFC surface 54, and/or mesa sidewalls 23 and/or recessed surface 21 may be reduced, or minimized, when compared to the wetting characteristics of surface 20. In this manner, the surfaces of template 10 facing substrate 16 are provided with differing wetting characteristics. One manner in which to achieve this is to establish the appropriate surface energies, for a given imprinting material 12, among the various surfaces of template 10. For example, it is desired to establish surface 20 to have the lowest surface energy characteristics.

Referring to FIG. 4, implementing these principles in conjunction with template 50 may facilitate greater control over the extrusion of imprinting material 12 outside of the volumetric gap. For example, the desired surface energy for surface 54, or mesa sidewall 55 and recessed surface 57, may be established based upon the surface tension of imprinting material 12 and the surface energy of patterned surface 60 of mold 52. It should be understood that it is not necessary that each of CFC surface 54, mesa sidewall 55 and recessed surface 57 have the same surface energy.

One manner in which to establish the surface energy of CFC surface 54, mesa sidewall 55 and recessed surface 57 employs application of a low surface energy coating formed by methods including, but not limited to, chemical vapor deposition (CVD), physical vapor deposition (PVD), thermal oxidation, and ion implantation. An exemplary technique, to that end, may include application of fluorine-containing materials, such as electroless nickel coating containing fluorinated particles.

Moreover, a fluorinated composition employed for the low surface energy coating may be dissolved or dispersed in a solvent or other suitable fluid which may be applied to the desired surfaces of template 50 employing one or more of a plurality of methods: dipping, spraying, and brushing. Additional processing may improve the density of the low surface energy coating and increase the bonding of the low surface energy coating to improve the durability of the same. Alternatively, a fluorine-containing compound may be left upon the desired surfaces of template 50 by exposing the same to fluorine-containing etchant chemistries.

An exemplary fluorine-containing composition includes a solution comprised of a hydrofluoroether solvent and tridecafluoro-1,1,2,2-tetrahydrooctyltrichlorosilane (FOTS). The solution may be dispensed via a pipette upon one or more of CFC surface 54, mesa sidewall 55 and recessed surface 57. The ratio of FOTS to hydrofluoroether is approximately 1 microliter of FOTS per 3.5 milliliters of hydrofluoroether. The component hydrofluoroether is available from 3M located in St. Paul, Minn. under the trade name HFE-7100DL. After application of FOTS, the template may be dried employing nitrogen. Another fluorine-containing composition may include a solution of a mono-functional silane having a perfluoropolyether backbone or a di-functional silane having a perfluoropolyether backbone in a fluorinated solvent.

Other materials and processes may be employed to vary surface energies of various surfaces of template 50. For example, a sol-gel layer may be formed upon CFC surface 54, mesa sidewall 55 and recessed surface 57. Additionally, one or more of CFC surface 54, mesa sidewall 55 and recessed surface 57 may be provided with a roughened surface for example, providing the same with a fractal structure, which is subsequently coated with a highly ordered low surface energy self-assembled monomer layer, as disclosed by Shibuichi et al. in SUPER WATER-AND OIL-REPELLANT SURFACE RESULTING FROM FRACTAL STRUCTURE, Journal of Colloid and Interface Science 208, 287-294 (1998). To that end, one or more of CFC surface 54, mesa sidewall 55 and recessed surface 57 would be subjected to an anode oxidation method as disclosed therein and then coated with a composition containing long chain fluorinated silanes, such as, one of 1H,1H,2H,2H-perfluorooctyltrichlorosilane, 1H,1H,2H,2H-perfluorodecyl phosphate and the like. Monolayers formed from these structures have been shown to exhibit surface energies of approximately 6 mN/m.

With the aforementioned coatings on one or more of CFC surface 54, mesa sidewall 55 and recessed surface 57, along with the various shapes with which CFC surface 54 may be configured, control over the quantity of imprinting material 12 extruding from the volumetric gap may be greatly facilitated. For example, for a given quantity of imprinting material 12 and aspect ratio of recessions 62 it may be possible to arrange the relative surface energies of CFC surface 54, mesa sidewall 55 and recessed surface 57, as well as the dimensions thereof, whereby a resulting flow velocity of imprinting material 12 would cause recessions 62 to be filled with imprinting material 12, before any, or a greater than desired amount of, imprinting material 12 extrudes outside the volumetric gap. Thus, the imprinting material 12 may be cured while minimizing the quantity of uncured imprinting material 12 that remains and/or the dimension of any extrusions formed.

In a further embodiment, to further control over the quantity of imprinting material extruding outside of region 18 is achieved by exposing the same to an oxygen rich fluid environment. Specifically, by directing a stream of oxygen rich fluid directed to CFC surface 54, mesa sidewall 55 and recessed surface 57, imprinting material 12 disposed thereon will be prevented from curing. Further, exposure to a stream of oxygen may facilitate evaporation of imprinting material 12 upon which the fluid stream impinges. Currently, the environs surrounding template 50 are saturated with helium to prevent trapping of air in imprinting material 12. However, prior to exposing imprinting layer 12 to actinic radiation, the stream of oxygen rich fluid may be introduced, with or without interrupting the supply of helium. Furthermore, employing the aforementioned helium flow may facilitate in varying a shape of an edge of the cured portion of imprinting material 12 with respect to the CFC surface 54, shown in FIG. 4, by varying the time of employment of the helium flow with respect to the imprinting process.

The embodiments of the present invention described above are exemplary. Many changes and modifications may be made to the disclosure recited above, while remaining within the scope of the invention. Therefore, the scope of the invention should not be limited by the above description, but instead should be determined with reference to the appended claims along with their full scope of equivalents.

What is claimed is:

1. A nanoimprint lithography template comprising:

a mold, having a periphery, lying in a plane;

a sidewall;

a recessed surface spaced-apart from said plane; and a control surface extending from said periphery toward said sidewall, with an obtuse angle being defined between said control surface and said plane, said sidewall extending between said control surface and said recessed surface.

2. The nanoimprint lithography template as recited in claim 1 wherein said control surface substantially surrounds said mold.

3. The nanoimprint lithography template as recited in claim 1 wherein said control surface has an arcuate shape.

4. The nanoimprint lithography template as recited in claim 1 wherein said control surface has a linear shape.

5. The nanoimprint lithography template as recited in claim 1 wherein said control surface has a concave shape.

6. The nanoimprint lithography template as recited in claim 1 wherein said control surface has a convex shape.

7. The nanoimprint lithography template as recited in claim 1 wherein said mold has a surface energy associated therewith that is greater than a surface energy of said control surface.

8. A nanoimprint lithography template comprising:

a mold, having a periphery, lying in a plane;

a recessed surface spaced-apart from said plane;

a sidewall surface; and a control surface extending between said periphery and said sidewall surface, with an obtuse angle being defined between said control surface and said plane, said sidewall surface extending between said control surface and said recessed surface, with said recessed surface extending orthogonally to said sidewall surface.

9. The nanoimprint lithography template as recited in claim 8 wherein said control surface substantially surrounds said mold.

10. The nanoimprint lithography template as recited in claim 8 wherein said control surface has an arcuate shape.

11. The nanoimprint lithography template as recited in claim 8 wherein said control surface has a linear shape.

12. The nanoimprint lithography template as recited in claim 8 wherein said control surface has a concave shape.

13. The nanoimprint lithography template as recited in claim 8 wherein said control surface has a convex shape.

14. A nanoimprint lithography template comprising:

a mold, having a periphery, lying in a plane;

a sidewall;

a recessed surface spaced-apart from said plane; and a control surface extending from said periphery toward said sidewall, with said control surface surrounding said mold, with an obtuse angle being defined between said control surface and said plane with said sidewall extending between said control surface and said recessed surface, with said mold having a surface energy associated therewith that is greater than a surface energy of said control surface, said sidewall and said recessed surface.

15. The nanoimprint lithography template as recited in claim 14 wherein said control surface has a shape associated therewith selected from a set of shapes consisting essentially of a linear shape, a concave shape and a convex shape.

* * * * *